(12) United States Patent
Mizukoshi et al.

(10) Patent No.: US 12,704,535 B2
(45) Date of Patent: Aug. 11, 2026

(54) ELECTRICAL CHARACTERISTIC ACQUIRING DEVICE

(71) Applicant: FUJI CORPORATION, Chiryu (JP)

(72) Inventors: Tsuyoshi Mizukoshi, Chiryu (JP); Masashi Kimura, Nishio (JP); Shuhei Mizutani, Yatomi (JP)

(73) Assignee: FUJI CORPORATION, Chiryu (JP)

( * ) Notice: Subject to any disclaimer, the term of this patent is extended or adjusted under 35 U.S.C. 154(b) by 135 days.

(21) Appl. No.: 18/718,257

(22) PCT Filed: Dec. 21, 2021

(86) PCT No.: PCT/JP2021/047312
§ 371 (c)(1),
(2) Date: Jun. 10, 2024

(87) PCT Pub. No.: WO2023/119417
PCT Pub. Date: Jun. 29, 2023

(65) Prior Publication Data

US 2025/0052794 A1 Feb. 13, 2025

(51) Int. Cl.
*G01R 27/26* (2006.01)
*G01R 35/00* (2006.01)

(52) U.S. Cl.
CPC ............ *G01R 27/26* (2013.01); *G01R 35/00* (2013.01)

(58) Field of Classification Search
None
See application file for complete search history.

(56) References Cited

U.S. PATENT DOCUMENTS 4,621,226 A * 11/1986 Powell .................. G01R 27/06 324/630
10,083,265 B2 * 9/2018 Tanzawa ........... G11C 13/0021

FOREIGN PATENT DOCUMENTS

| | | | | | |
|---|---|---|---|---|---|
| CN | 115932397 | A | * | 4/2023 | |
| JP | 2015-21728 | A | | 2/2015 | |
| WO | WO-2018109831 | A1 | * | 6/2018 | ............... G01K 3/00 |
| WO | WO-2018150446 | A1 | * | 8/2018 | ......... G01R 31/2893 |
| WO | WO-2019130411 | A1 | * | 7/2019 | ............ G01R 31/00 |

(Continued)

OTHER PUBLICATIONS

English translation of WO 2018/109831 A1 (Year: 2018).*

(Continued)

*Primary Examiner* — Jermele M Hollington
(74) *Attorney, Agent, or Firm* — Oblon, McClelland, Maier & Neustadt, L.L.P.

(57) ABSTRACT

An object of the present disclosure is to acquire an open correction value in a good manner. In an electrical characteristic acquiring device according to the present disclosure, an open correction value, which is an electrical characteristic when the interval between a pair of probes is the length of a component to be measured on an electrode side, is calculated based on the measurement value of the electrical characteristic when the interval between the pair of probes is a set length, a set length, and the length of the component on the electrode side. Therefore, even when it is difficult to adjust the interval between the pair of probes, the open correction value can be accurately acquired. In addition, it is not necessary to measure the open correction value every time the component to be measured is changed, and the work efficiency can be improved accordingly.

5 Claims, 11 Drawing Sheets

(56) References Cited

FOREIGN PATENT DOCUMENTS

| | | | | |
|---|---|---|---|---|
| WO | WO-2024232034 A1 * | 11/2024 | ............. | G01R 31/26 |
| WO | WO-2025191764 A1 * | 9/2025 | ............. | H05K 13/00 |

OTHER PUBLICATIONS

English translation of WO 2018/150446 A1 (Year: 2018).*
English translation of WO 2019/130411 A1 (Year: 2019).*
English translation of CN 115932397 A (Year: 2023).*
English translation of WO 2024/232034 A1 (Year: 2024).*
English translation of WO 2025/191764 A1 (Year: 2025).*
International Search Report mailed Feb. 15, 2022 in PCT/JP2021/047312 filed on Dec. 21, 2021, 2pages.

* cited by examiner 15A
15C
15B
15D
30
29a
36
56
31
87
36f
34f
86
72p
32
30a
44
46
90
29
34
72
44c
62
30a
y
x

ELECTRICAL CHARACTERISTIC ACQUIRING DEVICE

TECHNICAL FIELD

The present disclosure relates to an electrical characteristic acquiring device that acquires an electrical characteristic of an electronic component.

BACKGROUND ART

Patent Literature 1 discloses a jig for acquiring an open correction value when acquiring an impedance as an electrical characteristic of an electronic component. The surface of this jig is made of an insulator, and the thickness changes in multiple stages, and a floating admittance as an open correction value is measured while a portion of this jig whose thickness is the same as the length of the electrode side of the component is gripped by a pair of probes. As a result, it is possible to accurately acquire the floating admittance when the interval between the pair of probes is the same as the length on the electrode side of the component.

PATENT LITERATURE

Patent Literature 1: JP-A-2015-21728

Technical Problem

An object of the present disclosure is to acquire an open correction value in a good manner.

Solution to Problem

In an electrical characteristic acquiring device according to the present disclosure, an open correction value, which is an electrical characteristic when the interval between a pair of probes is the length of a component to be measured on an electrode side, is calculated based on the measurement value of the electrical characteristic when the interval between the pair of probes is a set length, a set length, and the length of the component to be measured on the electrode side.

Therefore, even when it is difficult to adjust the interval between the pair of probes, the open correction value can be accurately acquired.

In addition, it is not necessary to measure the open correction value every time the component to be measured is changed, and the work efficiency can be improved accordingly.

DESCRIPTION OF EMBODIMENTS

Hereinafter, a mounter including a measurement device as an electrical characteristic acquiring device according to an embodiment of the present disclosure will be described in detail with reference to drawings.

Example

Figure 1:
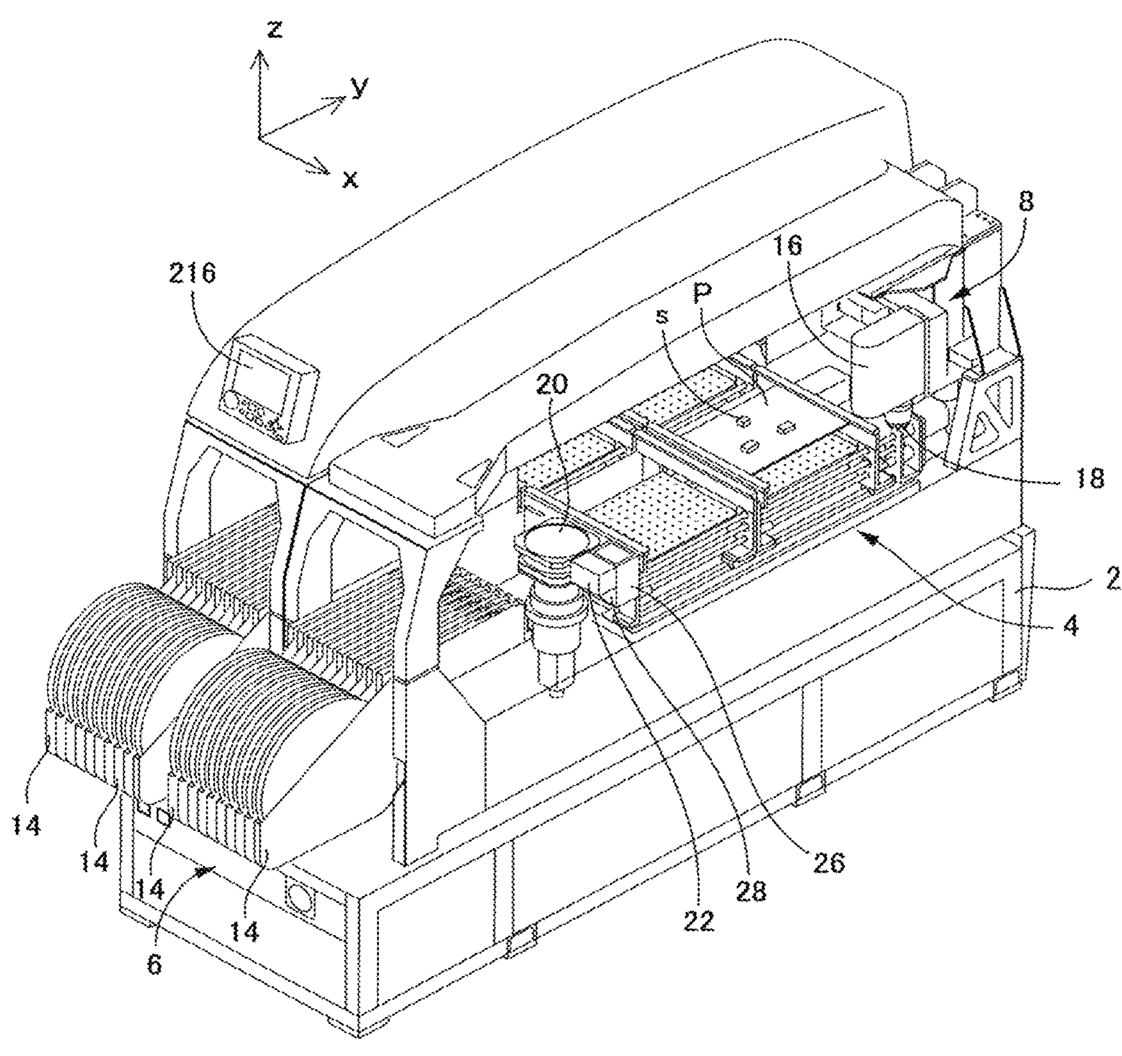
FIG. 1 is a perspective view of a mounter including an electrical characteristic acquiring device according to an embodiment of the present disclosure.

The mounter shown in FIG. 1 is intended to mount a component on a circuit board and includes main body 2, circuit board conveying and holding device 4, component supply device 6, head moving device 8, and the like.

Circuit board conveying and holding device 4 is intended to convey and hold circuit board P (hereinafter, referred simply to as board P) in a horizontal posture, and in FIG. 1, a conveyance direction of board P is referred to as an x-direction, a width direction of board P is referred to as a y-direction, and a thickness direction of board P is referred to as a z-direction. The y-direction and z-direction denote a front-rear direction and an up-down direction of the mounter, respectively. These x-direction, y-direction, and z-direction are orthogonal to one another. Component supply device 6 is intended to supply electronic component (hereinafter, referred simply to as a component) s to be mounted on board P and includes multiple tape feeders 14 and the like. Head moving device 8 is intended to hold and move mounting head 16 in the x-direction, y-direction, and z-direction, and mounting head 16 includes suction nozzle 18 that picks up and holds component s.

Reference numeral 20 denotes a camera. Camera 20 is intended to image component s held by suction nozzle 18, and it is determined whether component s is a component scheduled to be mounted on circuit board P based on an image captured by camera 20. Reference numeral 22 denotes a measurement device. Measurement device 22 is intended to measure electrical characteristics of component s. As the electrical characteristics of component s, L (inductance), C (capacitance), R (resistance, resistance value), X (reactance), Z' (impedance), and the like correspond thereto, and one or more of these electrical characteristics are measured by measurement device 22.

Figure 2:
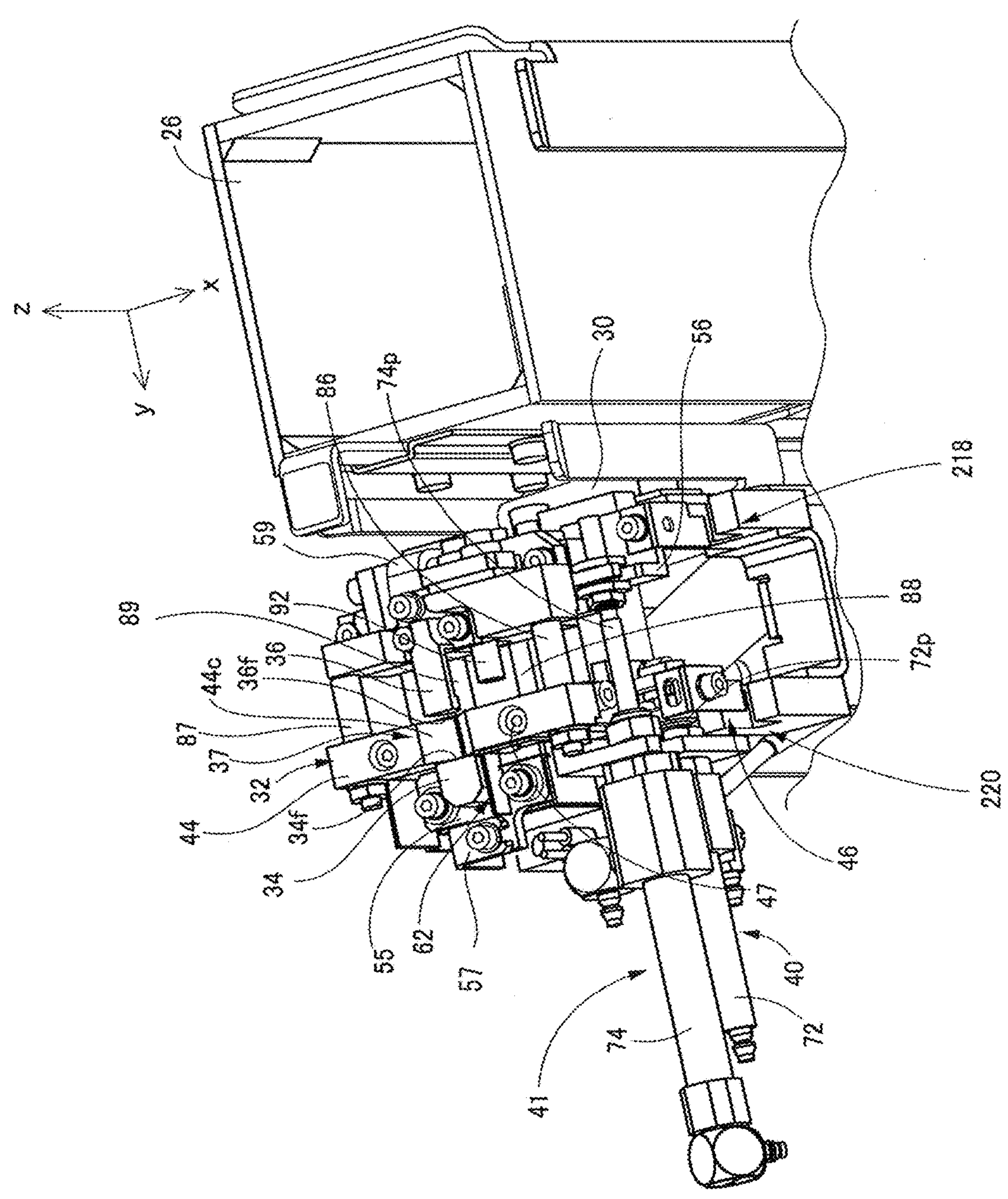
FIG. 2 is a perspective view of a main part of the electrical characteristic acquiring device.
Figure 3:
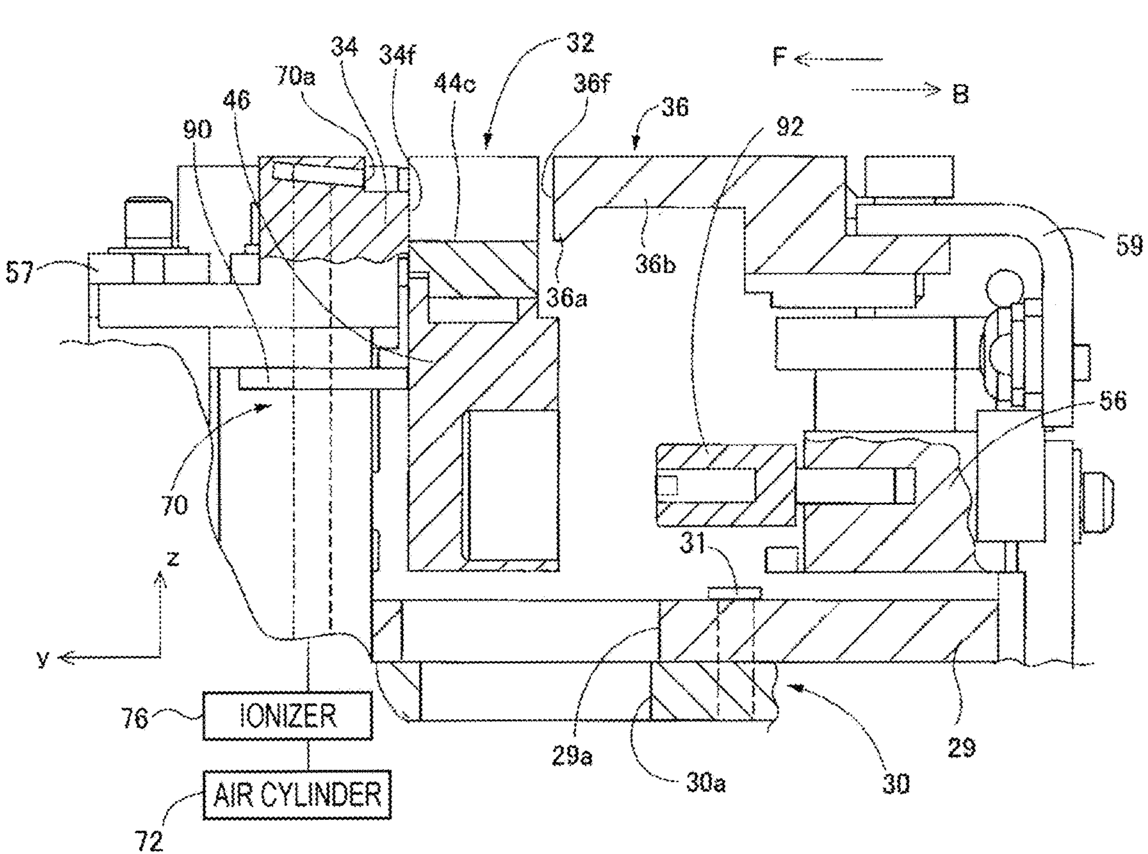
FIG. 3 is a cross-sectional view of the main part of the electrical characteristic acquiring device.

Measurement device 22 is mounted on the mounter, and is provided on the main body of circuit board conveying and holding device 4 via accommodating box 26. Waste passage 28 is provided between accommodating box 26 and measurement device 22, and component s whose electrical characteristics have been measured is accommodated in accommodating box 26 through waste passage 28. Measurement device 22 is provided in accommodating box 26 so as to be adjustable in height. As shown in FIGS. 2 and 3, base section 30 is engaged with accommodating box 26 so as to be lifted and lowered, and measurement table 29 is detachably held on base section 30 by fastening section 31 (hereinafter, the term "fastening section" broadly refers to a member that fastens two members together) (see FIGS. 3 and 4) including, for example, bolts and nuts. Base section 30 and measurement table 29 can be lifted and lowered integrally. Further, measurement table 29 and base section 30 are provided with through holes 29*a* and 30*a*, respectively, which can communicate with waste passage 28 (see FIGS. 3 and 4).

Figure 4:
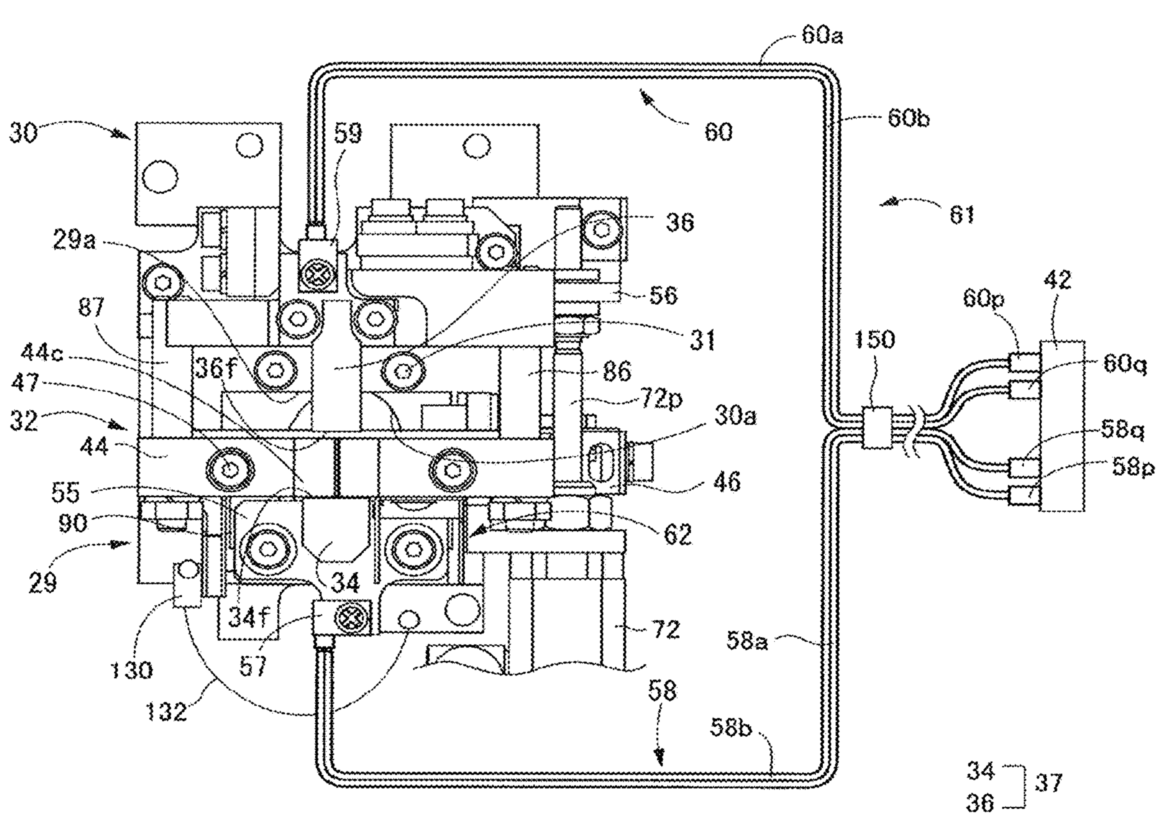
FIG. 4 is a partial plan view of the electrical characteristic acquiring device.
Figure 11:
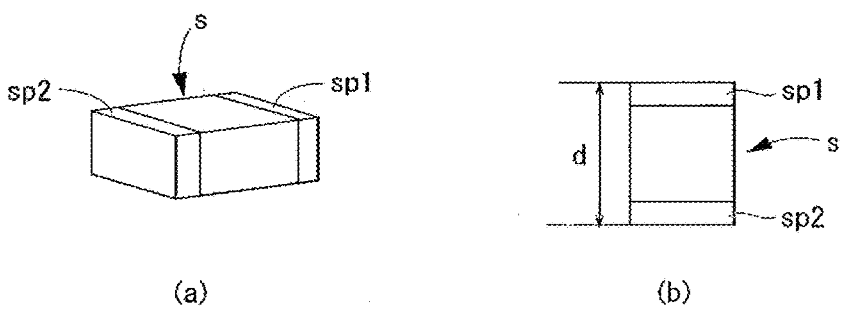
FIG. 11 is a view conceptually showing a component whose an electrical characteristic is acquired by the electrical characteristic acquiring device.

As shown in FIGS. 2 to 4, measurement device 22 includes measurement table 29 and base section 30, holding table 32 capable of holding component s, a pair of probes 37 including stator 34 and mover 36, holding table movement device 40 for moving holding table 32, mover movement device 41 as an approach and separation device for causing mover 36 to approach and separate away from stator 34, and measurement section 42 (see FIG. 4). In the present example, as shown in (a) and (b) in FIG. 11, component s has electrodes sp1 and sp2 at both ends and can be gripped by a pair of probes 37, and can be, for example, a square chip. For example, as shown in (b) of FIG. 11, component s as a square chip can be generally square in plan view, and length d of the side having electrodes sp1 and sp2 at both ends is referred to as length d of the electrode side of component s.

Holding table 32 includes component placement section 44 and placement section holding body 46 configured to hold component placement section 44. V-groove 44*c* is formed on component placement section 44, so that component s is placed therein. Component placement section 44 abuts against placement section holding body 46 and is fixed in place by fastening section 47. Further, placement section holding body 46 abuts against measurement table 29 via stopper 90 (see FIG. 3), and measurement table 29 is fixed to base section 30 by fastening section 31 as described above. Component placement section 44, placement section holding body 46, stopper 90, measurement table 29, base section 30, fastening sections 31 and 47, and the like are made of a conductive material that is a material having electrical conductivity. Further, base section 30 is grounded. Thus, component placement section 44 is grounded. In addition, accordingly, static electricity can be removed from component s placed on component placement section 44.

Each of stator 34 and mover 36 have facing surfaces 34*f* and 36*f* facing each other, and component s is gripped by the pair of facing surfaces 34*f* and 36*f*. Stator 34 is held by stator holding body 55, and stator holding body 55 is fixed to measurement table 29. Mover 36 is integrally movably held by mover holding body 56, and mover holding body 56 is provided movably with respect to measurement table 29. As a result, mover 36 is caused to approach and separate away from stator 34.

Facing surface 36*f* of mover 36 has a shape that can enter into V-groove 44*c* formed on the upper surface of holding table 32, in other words, has a generally triangular shape corresponding to V-groove 44*c*. Therefore, mover 36 can grip component s placed in V-groove 44*c* together with stator 34.

Further, mover 36 includes front end portion 36*a* including facing surface 36*f*, and has a shape in which front end portion 36*a* protrudes downward from intermediate portion 36*b*. Outer side surface of front end portion 36*a* is close to the inner side surface of V-groove 44*c*, but intermediate portion 36*b* has a shape that is largely separated from the inner side surface of V-groove 44*c*.

As shown in FIG. 4 and the like, coaxial cable section 58 is connected to stator holding body 55 via bracket 57, and coaxial cable section 60 is connected to mover holding body 56 via bracket 59. Since stator holding body 55, stator 34, mover holding body 56, mover 36, and brackets 57 and 59 are all made of a conductive material, stator 34, mover 36, and coaxial cable sections 58 and 60 are electrically connected. Further, electrical characteristic measurement circuit 61 is formed by stator 34, mover 36, and the like, coaxial cable sections 58 and 60, measurement section 42, and the like.

As shown in FIG. 3, air passage 70 is formed in the stator side member {for example, one or more of the upper part of stator 34, the portion of stator holding body 55 above stator 34, and measurement table 29}, and is connected to air cylinders 72 and 74 as fluid pressure cylinders. Opening 70*a* of air passage 70 is formed to face facing surface 36*f* of mover 36. Further, ionizer 76 is provided in air passage 70. Ionizer 76 generates corona discharge to ionize air.

Figure 5:
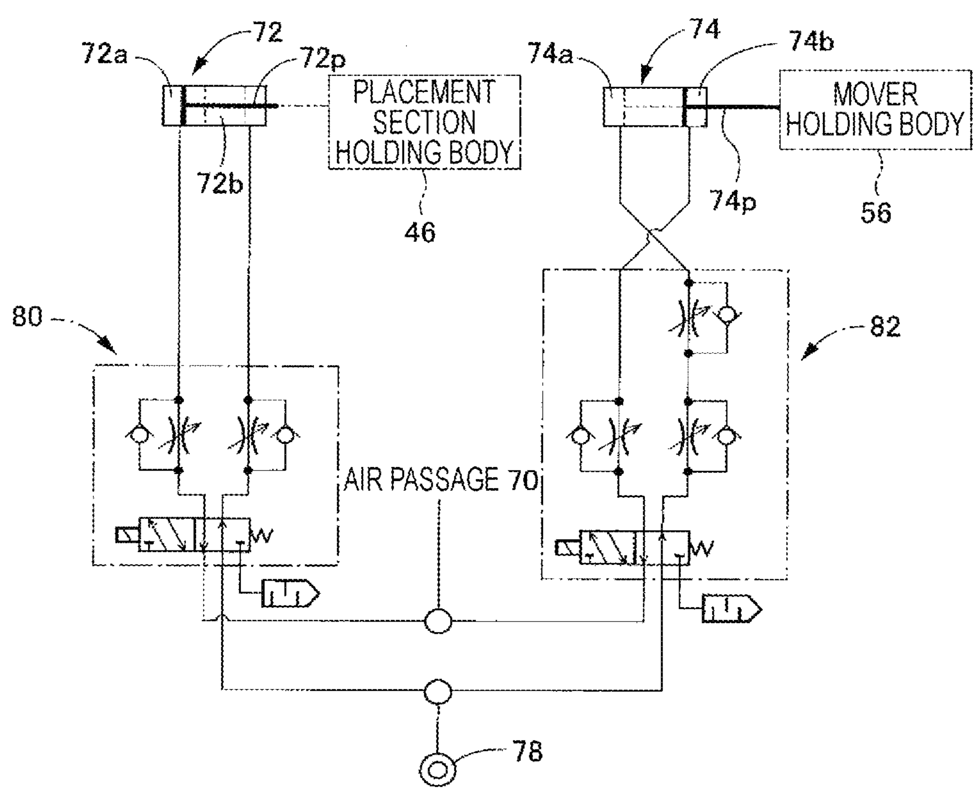
FIG. 5 is a view showing an air circuit provided in the electrical characteristic acquiring device.

As shown in FIG. 5, air cylinder 72 is a drive source for holding table movement device 40, and placement section holding body 46 is connected to piston rod 72*p* (see FIG. 5) of air cylinder 72. Solenoid valve device 80 is provided between two air chambers 72*a* and 72*b* of air cylinder 72, air source 78, air passage 70, and a filter (atmosphere). The movement of placement section holding body 46 (holding table 32) and the like are controlled by the control of solenoid valve device 80.

Air cylinder 74 is a drive source for mover movement device 41, and mover holding body 56 is connected to piston rod 74*p*. Air source 78, air passage 70, and the filter (atmosphere) are connected to air chambers 74*a* and 74*b* of air cylinder 74 via solenoid valve device 82. The movement of mover holding body 56 (mover 36) and the like are controlled by the control of solenoid valve device 82. Further, when holding table 32 moves forward and mover 36 retreats, air is supplied from air cylinders 72 and 74 to air passage 70 and is discharged from opening 70*a* toward mover 36.

A pair of guide rods 86 and 87 extending in the y-direction are provided on holding table 32 and mover holding body 56, and a pair of guide rods 88 and 89 extending in the y-direction are provided on mover holding body 56 and measurement table 29. Further, these guide rods 86, 87, 88, and 89 (see FIG. 2) allow holding table 32 and mover 36 to move relative to each other in the y-direction with respect to measurement table 29, and allow holding table 32 and mover 36 to move relative to each other in the y-direction.

Further, as shown in FIG. 3, stopper 92 is provided on the stator side of mover holding body 56, and stopper 90 is provided on the portion of measurement table 29 that holds stator holding body 55. Stopper 92 defines the approach limit between mover holding body 56 and holding table 32 (placement section holding body 46), and stopper 90 defines the approach limit between stator 34 (measurement table 29) and holding table 32.

Holding table 32 is moved by holding table movement device 40 between a position where holding table 32 abuts against stopper 90 and a position where holding table 32 abuts against stopper 92. In the case where holding table 32 is at a position where holding table 32 abuts against stopper 90, when a pair of probes 37 are separated (when mover 36 is separated from stator 34), at least a portion of holding table 32 is located between the pair of probes 37, and holding table 32 is at a state close to the pair of probes 37. When holding table 32 is at a position in contact with stopper 92, holding table 32 does not exist between a pair of probes 37 and is in a state of being separated from at least one of the pair of probes 37 (mover 36) by set distance a (see FIG. 12) or more.

Meanwhile, as shown in FIG. 4, the surface of measurement table 29 and the surface of base section 30 are electrically connected by ground wire 132. Further, a ground wire is also connected to base section 30 to remove static electricity from entire measurement device 22.

Figure 6:
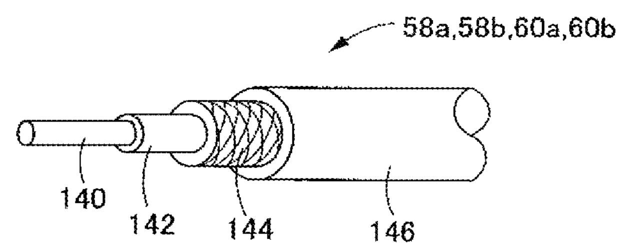
FIG. 6 is a view conceptually showing a coaxial cable used in the electrical characteristic acquiring device.

In electrical characteristic measurement circuit 61, as shown in FIG. 4, coaxial cable sections 58 and 60 respectively include two coaxial cables 58*a* and 58*b* and two coaxial cables 60*a* and 60*b*. Each of coaxial cables 58*a*, 58*b*, 60*a*, and 60*b* has the same structure, and as shown in FIG. 6, includes inner conductor 140, insulator (dielectric) 142, outer conductor 144, protective film 146, and the like, which are provided coaxially. Outer conductor 144 is often formed of a reticulated copper wire in which copper wires are woven in a net shape, and is usually connected to the ground. By providing outer conductor 144, leakage of the transmitted signal to the outside is suppressed. Therefore, the copper wire of outer conductor 144 can be referred to as a shield wire. Further, these inner conductor 140, insulator 142, and outer conductor 144 are covered with protective film 146.

In the present example, the electrical characteristics of component s are measured by an automatic balance bridge method, and coaxial cables 58*a*, 58*b*, 60*a*, and 60*b* are connected by a four-terminal-pair measurement method. The method of measuring the electrical characteristics of component s and the method of connecting coaxial cable sections 58 and 60 are not limited to the automatic balance bridge method and the four-terminal-pair measurement method.

Figure 8:
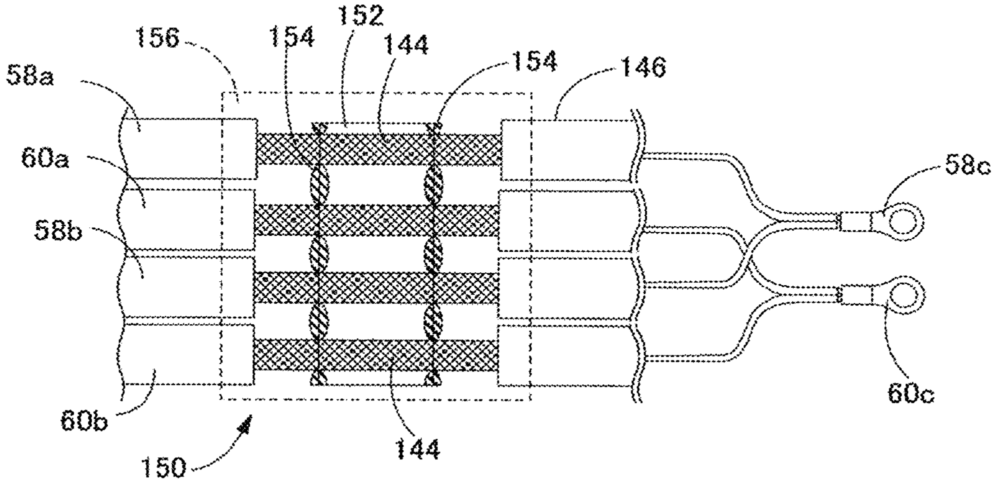
FIG. 8 is an exploded view of the same potential section.

As shown in FIG. 8, inner conductors 140 of coaxial cables 58*a* and 58*b* are respectively connected to one (the same) probe side connection portion 58*c*, and probe side connection portion 58*c* is attached to bracket 57. Inner conductors 140 of coaxial cables 60*a* and 60*b* are also connected to one probe side connection portion 60*c*, and probe side connection portion 60*c* is attached to bracket 59.

Figure 9:
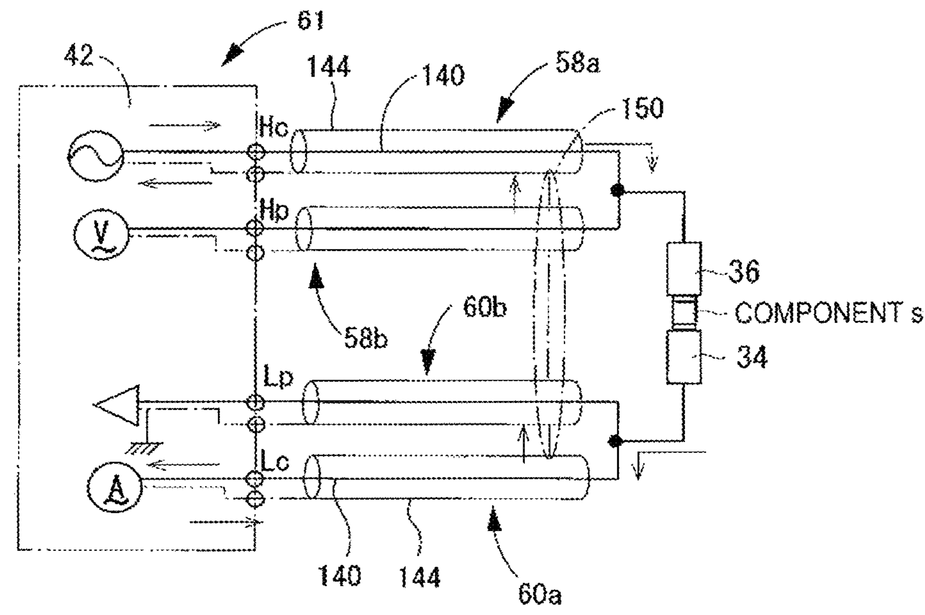
FIG. 9 is a view conceptually showing an electrical characteristic measurement circuit of the electrical characteristic acquiring device.

Further, as shown in FIGS. 4 and 9, detection section side connection sections 58*p*, 58*q*, 60*p*, and 60*q* which are second end portions of coaxial cables 58*a*, 58*b*, 60*a*, and 60*b* are respectively connected to terminals Hc, Hp, Lc, and Lp of measurement section 42.

As conceptually shown in FIG. 9, an AC power supply is connected to coaxial cable 58*a*. The output of the AC power supply is supplied to inner conductor 140 of coaxial cable 58*a* and returned through outer conductor 144. In coaxial cable 58*b*, a potential difference between inner conductor 140 and outer conductor 144 is detected as a voltage value applied to component s.

In coaxial cable 60*a*, a current flowing between inner conductor 140 and outer conductor 144 is acquired as a current value flowing through component s. Strictly speaking, a potential difference of a resistance having resistance value Rx (not shown) provided between inner conductor 140 and outer conductor 144 is acquired, and a current flowing through the resistance is acquired based on the potential difference and resistance value Rx. In coaxial cable 60*b*, a potential difference between inner conductor 140 and outer conductor 144 is detected, and elements (such as an oscillator) of measurement section 42 (not shown) are controlled so that the detected potential difference becomes zero. Accordingly, the current flowing through the resistance and the current flowing through component s become the same, and the current flowing through the resistance acquired at terminal Lc in this state is the current value flowing through component s.

Figure 7:
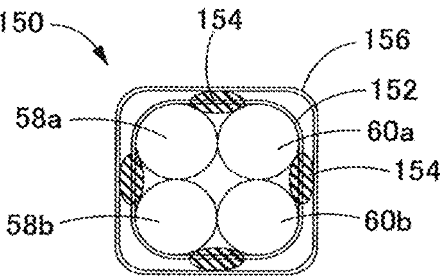
FIG. 7 is a cross-sectional view of a same potential section provided in the coaxial cable.

Each of coaxial cables 58*a*, 58*b*, 60*a*, 60*b* is provided with same potential section 150, and outer conductors 144 of coaxial cables 58*a*, 58*b*, 60*a*, and 60*b* are respectively electrically connected to each other at same potential section 150. As shown in FIGS. 7 and 8, protective film 146 is peeled off from each of coaxial cables 58*a*, 58*b*, 60*a*, and 60*b*, copper foil tape 152 is wound around exposed outer conductor 144, and solder 154 is attached. In other words, each of coaxial cables 58*a*, 58*b*, 60*a*, and 60*b* is located at the apex of the square, and the cables adjacent to each other are connected by solder 154. The portion where protective film 146 is peeled off and the like are covered with protective tube 156.

In this way, in same potential section 150, as shown in FIG. 9, outer conductors 144 of coaxial cables 58*a*, 58*b*, 60*a*, and 60*b* can be respectively electrically connected to each other, and the potentials of outer conductors 144 can be made the same. Outer conductors 144 of coaxial cables 58*a*, 58*b*, 60*a*, and 60*b* have the same ground potential, respectively.

When coaxial cables 58*a*, 58*b*, 60*a*, and 60*b* are connected by the four-terminal-pair measurement method as described above, the current flowing through component s and the voltage applied to component s are measured by separate circuits. In addition, since the currents flowing through inner conductor 140 and outer conductor 144 are opposite to each other, it is possible to suppress the generation of the magnetic flux of each of inner conductor 140 and outer conductor 144. As described above, the current and voltage flowing through component s can be accurately measured. Further, since outer conductors 144 of multiple coaxial cables 58 and 60 have the same ground potential respectively by providing same potential section 150, noise can be reduced, and the electrical characteristics of component s can be stably detected.

However, electrical characteristic measurement circuit (hereinafter, may be simply referred to as a measurement circuit) 61 is a portion provided exclusively in measurement device 22, and may be referred to as a test fixture (accessory). Meanwhile, when the electrical characteristics of component s are acquired in measurement circuit 61, if a current is supplied to cable sections 58 and 60 and the like, an electrical disturbance occurs in a portion other than component s, and the measured electrical characteristics which are the electrical characteristics of component s measured by measurement section 42 are affected. In order to reduce this influence, the disturbance (residual impedance, floating admittance) is obtained, the measured electrical characteristics are corrected, and the final electrical characteristics of component s are acquired.

Figure 10:
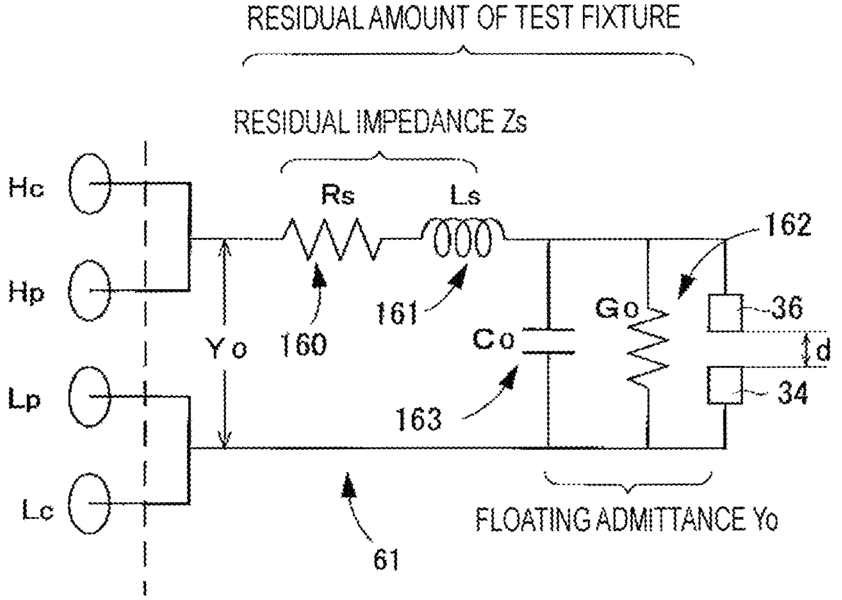
FIG. 10 is a view conceptually showing an equivalent circuit of the electrical characteristic measurement circuit.

FIG. 10 shows an equivalent circuit of this measurement circuit (test fixture) 61. In the equivalent circuit, it is assumed that resistor 160 and coil 161 are located in series with the pair of probes 37 (stator 34 and mover 36), and resistor 162 and capacitor 163 are located in parallel with the pair of probes 37. The residual impedance of measurement circuit 61 is the impedance generated in series with component s, and the floating admittance is the inverse of the impedance generated between the pair of probes 37 in parallel with component s. It can be assumed that the residual impedance is generated in resistor 160 and coil 161 in the equivalent circuit, and the floating admittance is generated in resistor 162 and capacitor 163.

Residual impedance Zs can be acquired as an impedance measured by measurement section 42 in a state where the pair of probes 37 are in contact with each other. The residual impedance can be referred to as a short-circuit correction value. In the present example, mover 36 approaches stator 34 by the control of solenoid valve device 80 and solenoid valve device 82 so that mover 36 and stator 34 are brought into contact with each other, and holding table 32 is caused to retreat until holding table 32 abuts against stopper 92 and is separated from the pair of probes 37. Holding table 32 is made of a conductive material, but in a state where holding table 32 is caused to retreat to the backward end position behind front end portion 36*a* of mover 36, the distance between mover 36 of the pair of probes 37 and holding table 32 becomes a set distance or more, and the influence of holding table 32 on the value measured by measurement section 42 is reduced. In this state, a short-circuit correction value is acquired as residual impedance Zs by measurement section 42.

Residual impedance Zs can be expressed by the following equation in the equivalent circuit of FIG. 10. Rs is a resistance value which is an electrical characteristic of resistor 160, and jLsω is an impedance which is an electrical characteristic of coil 161.

$$Zs = Rs + jLs\omega$$

The floating admittance can be acquired by measuring with measurement section 42 when the interval between the pair of probes 37 is length d on the electrode side of component s whose electrical characteristics are to be measured (target to be acquired). However, in the present example, mover 36 can approach and separate away from stator 34 by driving air cylinder 74. Therefore, it is difficult to adjust the interval between the pair of probes 37 to length d. Here, in the present example, in a steady state of measurement device 22, that is, in a state where mover 36 is at the backward end position, in other words, in a state in which the interval between the pair of probes 37 is predetermined set length x, floating admittance (which can be referred to as a reference floating admittance) Yox is measured by measurement section 42 and stored in advance. The open correction value is acquired based on reference floating admittance Yox, set length x, and length d of component s on the electrode side, and set length x, which is the interval between the pair of probes 37 in the initial state of measurement device 22 (the state where mover 36 is at the backward end position), is often known, but if not known, set length x can be actually measured and acquired.

Figure 12:
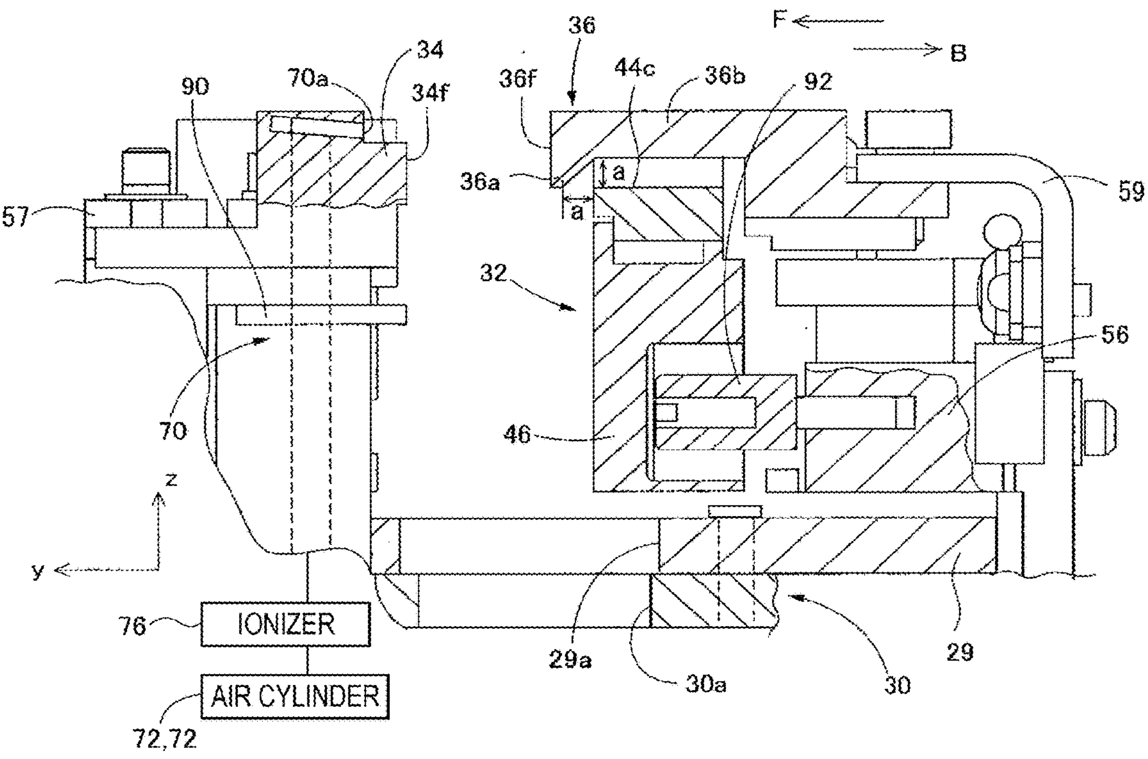
FIG. 12 is a view showing a relative positional relationship between a holding table and a pair of probes when acquiring an open correction value in the electrical characteristic device.

When reference floating admittance Yox is acquired, as shown in FIG. 12, in a state where the pair of probes 37 are separated from each other, holding table 32 is retracted to the backward end position where holding table 32 abuts against stopper 92 by the control of solenoid valve device 80.

When holding table 32 is located between the pair of probes 37 in a state where the pair of probes 37 are separated from each other, holding table 32 made of a conductive material comes close to or comes into contact with the pair of probes 37, and the presence of holding table 32 affects a measurement value (floating admittance) by measurement section 42.

In addition, it is desirable to set the same state as possible between the case of measuring reference floating admittance Yox and the case of measuring the electrical characteristics of component s. For example, it is desirable to set the thickness of the air layer existing between the pair of probes 37 to be substantially the same. In other words, it is desirable that the amount of air per unit length of the interval between the pair of probes 37 is the same.

As described above, when measuring reference floating admittance Yox, holding table 32 is moved to the backward end position at which holding table 32 does not exist between the pair of probes 37 and abuts stopper 92. In this state, holding table 32 is separated from mover 36 by set distance a or more, and it is possible to reduce the influence on the measurement value by measurement section 42 of holding table 32.

Reference floating admittance Yox can be expressed by the following equation. C is the capacitance of capacitor 163, and Ro is the resistance value of resistor 162.

$$Yox = jC\omega + 1/Ro$$

In the above equation, resistance value Ro is a resistance value of air, which is a very large value, because resistance value Ro is generated between the pair of separated probes 37. Therefore, 1/Ro can be considered to be almost 0.

From the above, reference floating admittance Yox can be expressed by the following equation.

$$Yox \approx jC\omega$$

Also, it is known that capacitance C of the capacitor is inversely proportional to the distance between a pair of electrodes.

Therefore, based on reference floating admittance Yox measured by measurement section 42 in a state where the interval between the pair of probes 37 is set length x, the open correction value which is floating admittance (which can be referred to as a floating admittance for component) Yod in the case of length d can be obtained according to the following equation by calculation.

$$Yod = Yox * x / d \quad (1)$$

In addition, the following equation is established between short-circuit correction value Zs, open correction value Yod, measured impedance Zm which is the measured electrical characteristic measured by measurement section 42 in a state where component s is gripped by the pair of probes 37, and final impedance Zdut of component s.

$$Zdut(Zm - Zs)Yod + (Zm - Zs) = Zdut$$

When the above equation is summarized, final impedance Zdut of component s can be expressed by the following equation.

$$Zdut=(Zm-Zs)/\{1-(Zm-Zs)Yod\} \quad (2)$$

In this way, in the present example, regardless of length d on the electrode side of component s, the open correction value can be acquired by calculation.

Figure 13:
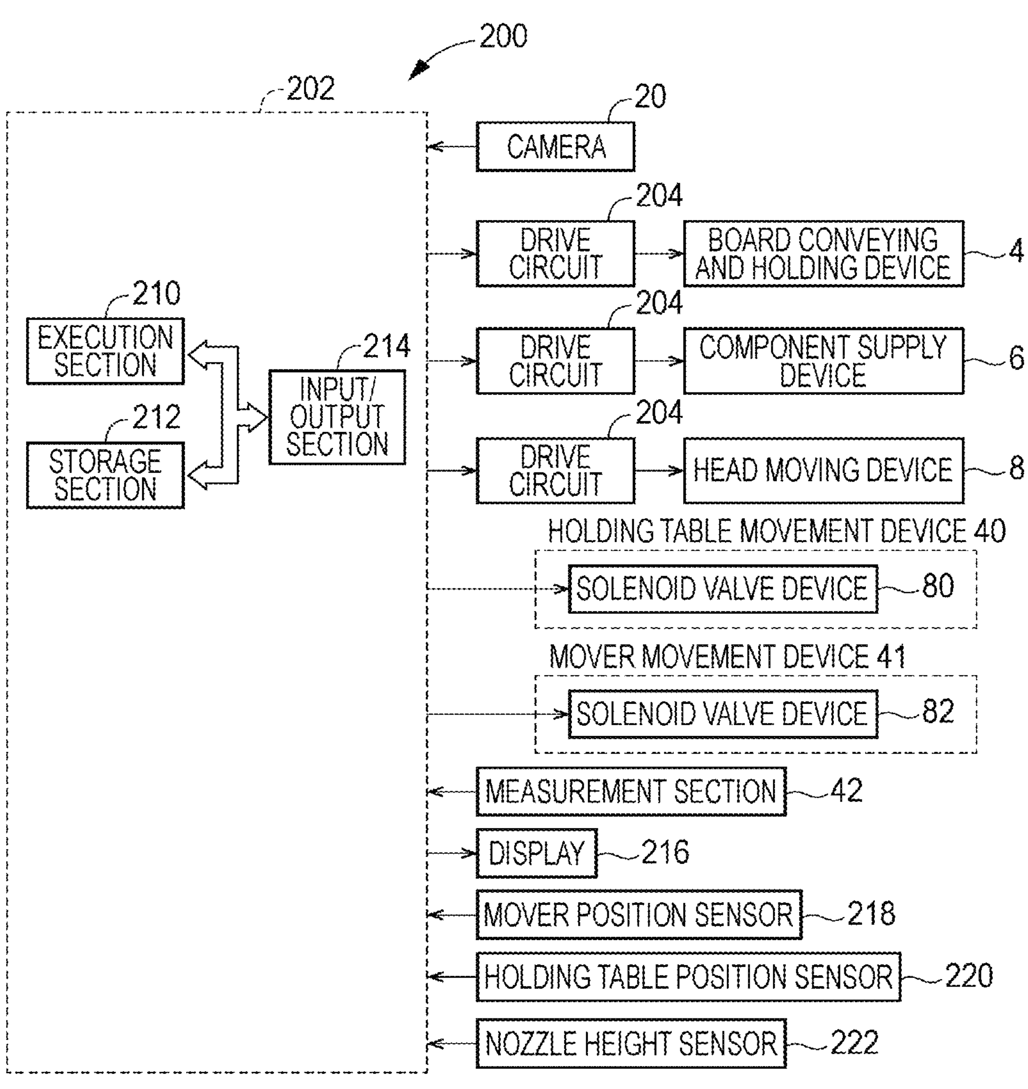
FIG. 13 is a block view conceptually showing the periphery of a control device of the electrical characteristic acquiring device.

The mounter includes control device 200. As shown in FIG. 13, control device 200 includes controller 202 mainly including a computer, and multiple drive circuits 204. Controller 202 includes execution section 210, storage section 212, input/output section 214, and the like. Board conveying and holding device 4, component supply device 6, and head moving device 8 are connected to input/output section 214 via drive circuit 204, respectively, and holding table movement device 40, solenoid valve devices 80 and 82 of mover movement device 41, and the like are connected. Further, measurement section 42, display 216, mover position sensor 218, holding table position sensor 220, nozzle height sensor 222, and the like are connected.

In the present example, storage section 212 stores set length x, reference floating admittance Yox in the case of set length x, and short-circuit correction value Zs. In addition, as operation plan information, the shape of component s from which the impedance is acquired (for example, including the length of the component on the electrode side), the default value of the impedance, and the like are input via an input device (not shown) or the like, and are stored in storage section 212 or a storage section different from storage section 212.

Figure 14:
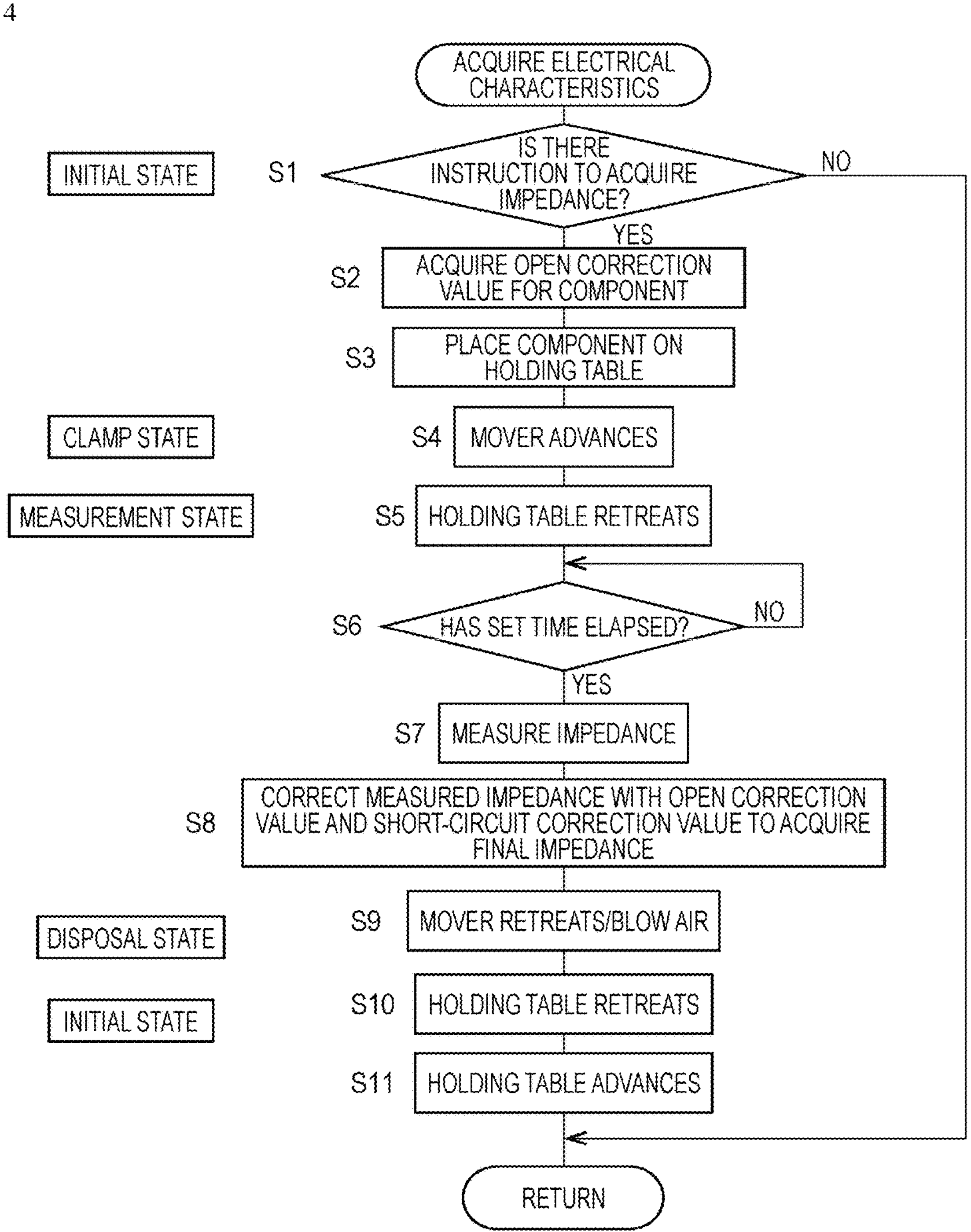
FIG. 14 is a flowchart showing an electrical characteristic acquiring program stored in a storage section of the control device.

The electrical characteristic of component s is measured by executing an electrical characteristic measurement program represented by a flowchart shown in FIG. 14.

Solenoid valve devices 80 and 82 are controlled based on the output signals of mover position sensor 218 and holding table position sensor 220, and the like. The measurement result can be displayed on display 216. Measurement device 22 is normally in an initial state shown in FIG. 15A. Mover 36 is at the backward end position, and holding table 32 is at the forward end position, that is, at a position where holding table 32 abuts against stopper 90.

In step 1 (hereinafter, abbreviated as S1, and the same applies to other steps), it is determined whether an instruction to measure the electrical characteristic of component s has been issued. For example, when an instruction to measure the electrical characteristics of component s is issued, such as when a setup change is performed, the determination is YES.

In S2, open correction value Yod for component s is obtained according to Equation (1). Reference floating admittance Yox stored in storage section 212, set length x, length d of the component to be measured on the electrode side, which is the component whose impedance is to be acquired next, are read, and according to Equation (1), floating admittance Yod for the component is acquired when the interval between the pair of probes 37 is length d of the component to be measured on the electrode side.

Next, in S3, mounting head 16 is moved. Mounting head 16 reaches V-groove 44*c*, suction nozzle 18 is lowered, component s is released, and component s is placed on V-groove 44*c*.

Figure 15:
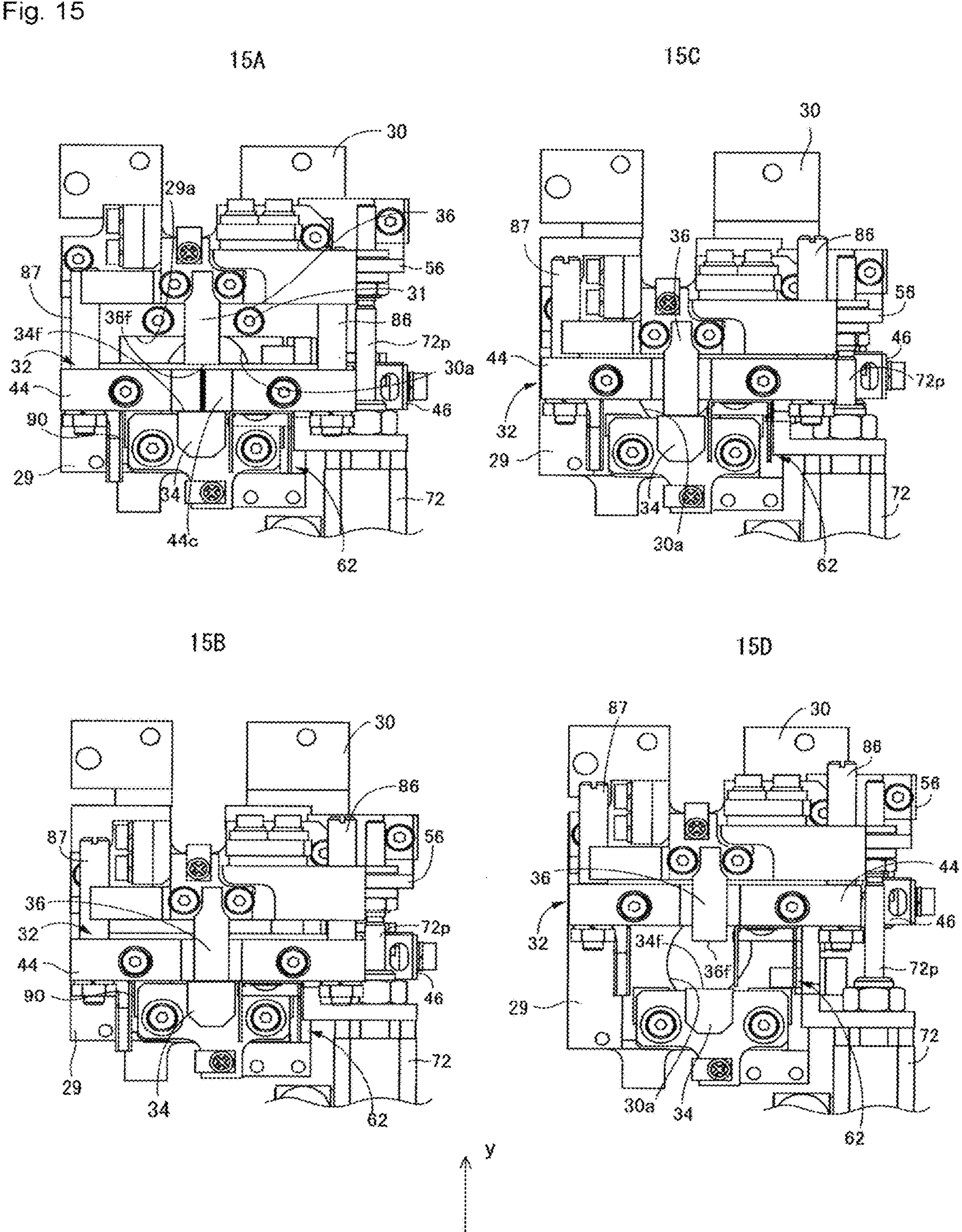
FIG. 15A is a view showing an initial state of the electrical characteristic acquiring device.
FIG. 15B is a view showing a clamp state.
FIG. 15C is a view showing a measurement state.
FIG. 15D is a view showing a disposal state.

In S4, mover 36 is caused to advance by the control of solenoid valve device 82, whereby component s is clamped by mover 36 and stator 34 as shown in FIG. 15B. In S5, as shown in FIG. 15C, holding table 32 is caused to retreat until holding table 32 abuts against stopper 92 by the control of solenoid valve device 80. Holding table 32 reaches a position where holding table 32 does not come into contact with component s and mover 36.

In S6, from the time when component s is released by suction nozzle 18 and placed on V-groove 44*c*, component s waits for a static electricity removal time which is a set time to elapse. The static electricity removal time is a time during which static electricity charged on component s is removed, and is determined in advance. When the elapsed time reaches the static electricity removal time, the determination in S6 is YES, and measured impedance Zm for component s is measured in S7. Then, final impedance Zdut of component s is obtained by substituting measured impedance Zm in S8, open correction value Yod obtained in S2, and short-circuit correction value Zs stored in storage section 212 into Equation (2). Further, final impedance Zdut may be displayed on display 216, or may be compared with a default value and the comparison result may be displayed on display 216.

After final impedance Zdut of component s is acquired, in S9, mover 36 is caused to retreat, and component s gripped between mover 36 and stator 34 is released. In addition, as mover 36 retreats, air is supplied from opening 70*a* to facing surface 36*f* of mover 36 from diagonally above. Accordingly, even if component s temporarily adheres to facing surface 36*f*, component s can be dropped in a good manner.

In S10, as shown in FIG. 15D, holding table 32 is caused to retreat. Since the space between mover 36 and stator 34 communicates with waste passage 28, component s can be accommodated in accommodating box 26. After holding table 32 is caused to retreat until holding table 32 abuts against stopper 92, in S11, holding table 32 is caused to advance to be located between a pair of facing surfaces 34*f* and 36*f*. A space is provided above V-groove 44*c*, on which component s can be placed, and measurement device 22 is returned to the initial state shown in FIG. 15A. In addition, since air containing ions is supplied to facing surface 36*f* of mover 36 as holding table 32 advances, it is also possible to remove static electricity from facing surface 36*f*.

As described above, in the present example, the open correction value is accurately acquired. As a result, the final impedance of component s can be accurately acquired. Even if component s to be measured has a small impedance, the impedance of component s can be accurately measured.

In addition, the open correction value can be more quickly and easily acquired by calculation even when component s to be measured is changed and the length of component s on the electrode side is changed. In each case, it is not necessary to adjust the interval between the pair of probes 37 to acquire the open correction value. As a result, a decrease in work efficiency can be suppressed.

As described above, in the present example, a processing section includes control device 200 and the like, and the electrical characteristic acquiring device is implemented by control device 200, measurement device 22, and the like. In addition, an open correction value acquisition section includes storage section 212, a portion that stores S2 of control device 200, a portion that executes S2, and the like.

S8 can be executed after S11.

Further, in the above example, the case where a measurement device as an electrical characteristic acquiring device is provided in a mounter has been described, but the measurement device can be used alone instead of being provided in the mounter.

Further, in the above example, the case where an impedance is acquired as an electrical characteristic has been described, but the impedance is not limited to the electrical characteristic, and other electrical characteristics such as a resistance value and a reactance can be acquired.

Hereinbefore, in addition to the aspects described in the embodiments, the present disclosure can be implemented with various changes and improvements based on the knowledge of those skilled in the art.

REFERENCE SIGNS LIST

22: measurement device, 32: holding table, 34: stator, 36: mover, 42: measurement section, 44: component placement section, 57, 59: bracket, 58, 60: coaxial cable section, 58*a*, 58*b*, 60*a*, 60*b*: coaxial cable, 61: electrical characteristic measurement circuit, 150: same potential section, 200: control device, 202: storage section Aspects of the Disclosure (1) An electrical characteristic acquiring device that is mounted on a mounter configured to pick up a component supplied by a component supply device and mount the component on a circuit board, the device being for acquiring an electrical characteristic of the component by a pair of probes gripping the component, the device including:

- a measurement section configured to measure the electrical characteristic of the component;
- an open correction value acquisition section configured to acquire an electrical characteristic as an open correction value by calculation when an interval between a pair of probes is a length of the component on an electrode side, based on an electrical characteristic measured by the measurement section when the interval between the pair of probes is a predetermined set length, the set length, and the length of the component on the electrode side; and
- a processing section configured to correct the measured electrical characteristic which is the electrical characteristic of the component measured by the measurement section, with at least the open correction value acquired by the open correction value acquisition section to acquire a final electrical characteristic of the component.

The component can be gripped by a pair of probes, and has the pair of electrodes facing each other. Length of the component on the side where the pair of electrodes face each other is referred to as an electrode side length.

The final electrical characteristic is electrical characteristics output by the electrical characteristic acquiring device, and can be referred to as an output electrical characteristic. The final electrical characteristic is a value closer to the true electrical characteristic of the component than the measured electrical characteristic.

(2) The electrical characteristic acquiring device according to Item (1), in which the open correction value acquisition section acquires a floating admittance by calculation when the interval between the pair of probes is the length of the electrode side of the component as the open correction value, based on a floating admittance as the electrical characteristic measured by the measurement section when the interval between the pair of probes is the set length, the set length, and the length of the component on the electrode side.

The measurement section corrects the measured impedance, which is the measured electrical characteristic, with at least the open correction value to acquire a final impedance, which is the final electrical characteristic of the component.

(3) The electrical characteristic acquiring device according to Item (2), further including:

- a storage section configured to store in advance the set length and a reference floating admittance which is the floating admittance measured by the measurement section when the interval between the pair of probes is the set length.

The open correction value acquisition section acquires an open correction value (a floating admittance for the component, which is a floating admittance when the interval between the pair of probes is the length of the component on the electrode side) by calculation based on the length of the component to be measured on the electrode side (measurement target), the set length, and the reference floating admittance stored in the storage section.

(4) The electrical characteristic acquiring device according to any one of Items (1) to (3), further including:

- an approach and separation device configured to cause the pair of probes to approach and separate away from each other, in which the approach and separation device includes a fluid pressure cylinder.

The fluid pressure cylinder may be an air cylinder or a hydraulic cylinder. When the approach and separation device includes a fluid pressure cylinder, the cost can be reduced as compared with the case of including a motor.

(5) The electrical characteristic acquiring device according to any one of Items (1) to (4), further including:

- a holding table configured to move between a position between the pair of probes and a position deviated from the position between the pair of probes and hold the component, in which
- the measurement section measures the electrical characteristic in a state where the holding table is located at the position deviated from the position between the pair of probes when the interval between the pair of probes is the set length.

(6) The electrical characteristic acquiring device according to Item (5), in which

- the pair of probes can grip the component placed on the component placement section of the holding table by approaching each other,
- at least a part of the holding table exists between the pair of probes at a position between the pair of probes, and
- at the deviated position, a distance between the holding table and at least one of the pair of probes is a set distance or more.

In the electrical characteristic acquiring device according to this aspect, a distance between the probe (in the above example, mover 36) of the pair of probes, which is closer to the holding table, and the holding table is greater than or equal to set distance a.

(7) The electrical characteristic acquiring device according to any one of Items (1) to (6), in which

- the pair of probes and the measurement section are respectively connected by two coaxial cables, and
- the two coaxial cables are connected to the measurement section by a four-terminal-pair measurement method.

(8) The electrical characteristic acquiring device according to any one of Items (1) to (7), further including:

- a pair of coaxial cable sections configured to be respectively connected to the pair of probes; and
- a same potential section configured to be provided in the pair of coaxial cable sections in which outer conductors of multiple coaxial cables provided in the pair of coaxial cable sections are electrically connected to each other to have the same potential.

(9) An electrical characteristic acquiring device that is mounted on a mounter configured to pick up a component supplied by a component supply device and mount the component on a circuit board, the device being for acquiring an impedance as an electrical characteristic of the component by a pair of probes gripping the component, the device including:

a measurement section configured to measure the electrical characteristic of the component; and a processing section configured to correct the measured impedance which is an impedance as the electrical characteristic of the component measured by the measurement section with at least the open correction value to acquire a final impedance of the component, in which the processing section includes an open correction value acquisition section configured to acquire a floating admittance as the open correction value when the interval between the pair of probes is the length of the component on the electrode side by calculation based on the floating admittance as the electrical characteristic measured by the measurement section when the interval between the pair of probes is a predetermined set length, the set length, and the length of the component on the electrode side.

The electrical characteristic acquiring device described in this aspect can adopt the technical feature described in any one of Items (1) to (8).

Further, the electrical characteristic acquiring device does not necessarily need to be provided in the mounter, and can be used alone.

(10) An open correction value acquisition method for acquiring an open correction value used when acquiring an electrical characteristic of a component, the method including:

a measurement step of measuring the electrical characteristic by a measurement section when an interval between a pair of probes is a predetermined set length; and an open correction value acquisition step of acquiring the electrical characteristic when the interval between the pair of probes is a length of the component on an electrode side as the open correction value, based on the electrical characteristic measured in the measurement step, the set length, and the length of the component on the electrode side.

In the open correction value acquisition method described in this aspect, the technical features described in any one of Items (1) to (10) can be adopted.

The invention claimed is:

1. An electrical characteristic acquiring device that is mounted on a mounter configured to pick up a component supplied by a component supply device and mount the component on a circuit board, the device being for acquiring an electrical characteristic of the component by a pair of probes gripping the component, the device comprising:

a measurement section configured to measure the electrical characteristic of the component; and a controller configured to acquire an electrical characteristic as an open correction value by calculation when an interval between the pair of probes is equal to a length of the component on an electrode side, based on an electrical characteristic measured by the measurement section when the interval between the pair of probes is a predetermined set length, the set length, and the length of the component on the electrode side; and correct the measured electrical characteristic which is the electrical characteristic of the component measured by the measurement section, with at least the acquired open correction value to acquire a final electrical characteristic of the component, wherein the electrical characteristic is an impedance of the component.

2. The electrical characteristic acquiring device according to claim 1, wherein the controller acquires a floating admittance by calculation when the interval between the pair of probes is the length of the component on the electrode side as the open correction value, based on said floating admittance as the electrical characteristic measured by the measurement section when the interval between the pair of probes is the set length, the set length, and the length of the component on the electrode side.

3. The electrical characteristic acquiring device according to claim 2, further comprising:

a storage section configured to store in advance the set length and a reference floating admittance that is the floating admittance measured by the measurement section when the interval between the pair of probes is the set length.

4. The electrical characteristic acquiring device according to claim 1, further comprising:

an approach and separation device configured to cause the pair of probes to approach and separate away from each other, wherein the approach and separation device includes a fluid pressure cylinder.

5. The electrical characteristic acquiring device according to claim 1, further comprising:

a holding table configured to move between a position between the pair of probes and a position deviated from the position between the pair of probes and hold the component, wherein the measurement section measures the electrical characteristic in a state where the holding table is located at the position deviated from the position between the pair of probes when the interval between the pair of probes is the set length.

* * * * *